(12) United States Patent
Lee et al.

(10) Patent No.: US 10,595,450 B2
(45) Date of Patent: Mar. 17, 2020

(54) MAGNETIC SHEET FOR COMMUNICATIONS MODULE

(71) Applicant: WITS Co., Ltd., Yongin-si, Gyeonggi-do (KR)

(72) Inventors: Seung Min Lee, Suwon-si (KR); Jung Young Cho, Suwon-si (KR); Jung Wook Seo, Suwon-si (KR); Doo Ho Park, Suwon-si (KR)

(73) Assignee: WITS Co., Ltd., Gyeonggi-do (KR)

( * ) Notice: Subject to any disclaimer, the term of this patent is extended or adjusted under 35 U.S.C. 154(b) by 430 days.

(21) Appl. No.: 15/133,503

(22) Filed: Apr. 20, 2016

(65) Prior Publication Data

US 2016/0345473 A1 Nov. 24, 2016

(30) Foreign Application Priority Data

May 22, 2015 (KR) .................... 10-2015-0072176
Aug. 4, 2015 (KR) .................... 10-2015-0110038

(51) Int. Cl.
*H05K 9/00* (2006.01)
*H04B 5/00* (2006.01)
*H01F 27/36* (2006.01)
*H02J 7/02* (2016.01)
*H02J 50/10* (2016.01)
(Continued)

(52) U.S. Cl.
CPC ......... *H05K 9/0081* (2013.01); *H01F 27/365* (2013.01); *H04B 5/0025* (2013.01); *H04B 5/0031* (2013.01); *H04B 5/0037* (2013.01); *H01F 38/14* (2013.01); *H01F 2003/106* (2013.01); *H02J 7/025* (2013.01); *H02J 50/10* (2016.02)

(58) Field of Classification Search
CPC .. H05K 9/0081; H05K 9/0088; H05K 9/0073; H05K 9/0003; H01F 27/365; H01F 2003/106; H01F 38/14; H04B 5/0031; H04B 5/0037; H04B 5/0025; H02J 50/10; H02J 7/025
See application file for complete search history.

(56) References Cited

U.S. PATENT DOCUMENTS 8,690,059 B1 * 4/2014 Wallner ................. G06K 7/08
235/380
9,252,611 B2 2/2016 Lee et al.
(Continued)

FOREIGN PATENT DOCUMENTS

CN 101615717 A 12/2009
CN 103918048 A 7/2014
(Continued)

OTHER PUBLICATIONS

Machine Translation of JP 2009/182062 (Year: 2009).*
(Continued)

*Primary Examiner* — Brian Handville
(74) *Attorney, Agent, or Firm* — Harness, Dickey & Pierce, P.L.C.

(57) ABSTRACT

A magnetic sheet for a communications module includes a magnetic material. The magnetic sheet includes crushed cracks in a first region and a second region disposed adjacent to the first region. Degrees of crushed cracks are different in the first region and the second region.

19 Claims, 3 Drawing Sheets

(51) Int. Cl.
    *H01F 3/10*     (2006.01)
    *H01F 38/14*     (2006.01)

(56) References Cited

U.S. PATENT DOCUMENTS

| | | | |
|---|---|---|---|
| 2009/0120681 A1* | 5/2009 | Matsuzaki | H01F 17/06 |
| | | | 174/350 |
| 2009/0315798 A1 | 12/2009 | Nam et al. | |
| 2014/0134401 A1 | 5/2014 | Park et al. | |
| 2014/0145674 A1 | 5/2014 | Jang et al. | |
| 2014/0239892 A1 | 8/2014 | Sawa et al. | |
| 2014/0320369 A1* | 10/2014 | Azenui | H01Q 1/526 |
| | | | 343/841 |
| 2015/0123604 A1* | 5/2015 | Lee | H01F 38/14 |
| | | | 320/108 |

FOREIGN PATENT DOCUMENTS

| | | |
|---|---|---|
| CN | 104011814 A | 8/2014 |
| JP | 2009-182062 A | 8/2009 |
| KR | 10-2014-0062730 A | 5/2014 |
| KR | 10-2014-0131310 A | 11/2014 |
| KR | 10-2015-0019731 A | 2/2015 |
| KR | 10-1490513 B1 | 2/2015 |
| KR | 10-2015-0032382 A | 3/2015 |
| WO | WO-2013095036 A1 * | 6/2013 ............. H01F 38/14 |

OTHER PUBLICATIONS

Machine Translation of KR 10-2014-0131310. (Year: 2014).*
Korean Office Action issued in Application No. 10-2015-0110038 dated Aug. 18, 2016, with English translation.
Office Action issued in Chinese Application No. 201610319576.3 dated Jun. 5, 2018.

\* cited by examiner

MAGNETIC SHEET FOR COMMUNICATIONS MODULE

CROSS-REFERENCE TO RELATED APPLICATION

This application claims the priority and benefit of Korean Patent Application Nos. 10-2015-0072176 and 10-2015-0110038, filed, on May 22, 2015 and Aug. 4, 2015, respectively with the Korean Intellectual Property Office, the inventive concept of which is incorporated herein by reference.

TECHNICAL FIELD

The present inventive concept relates to a magnetic sheet for a communications module.

BACKGROUND

Recently, mobile devices have adopted a wireless power charging (WPC) function, a near field communications (NFC) function, a magnetic secure transmission (MST) function, or the like.

Such WPC, NFC, and MST functions are operated at different operating frequencies, and have different data transmission rates and different amounts of power transmission.

Meanwhile, due to a reduction in both size and weight of electronic devices, space efficiency has become important in order to perform the WPC, NFC, and MST functions. However, since such WPC, NFC, and MST functions require different operating frequencies and use shields having different magnetic permeabilities, different magnetic sheets formed of different magnetic materials need to be used.

SUMMARY

An aspect of the present inventive concept may provide a magnetic sheet for a communications module capable of maximizing space efficiency and simplifying a manufacturing process by simultaneously applying a magnetic sheet formed of the same material to a wireless power charging (WPC) shield, a near field communications (NFC) shield, and the like.

According to an aspect of the present inventive concept, a magnetic sheet for a communications module may include two or more regions formed of the same magnetic material but having different degrees of crushing.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Figure 1:
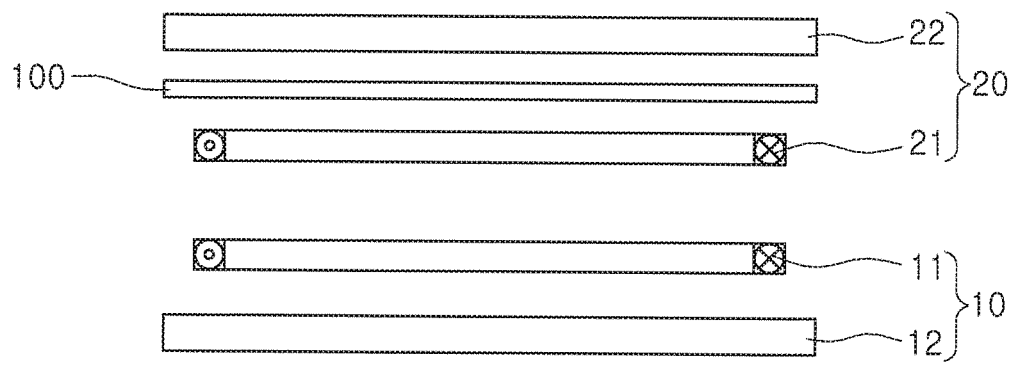
FIG. 1 is a cross-sectional view schematically illustrating an internal configuration of a normal wireless power charging (WPC) system.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer, or section from another region, layer, or section. Thus, a first member, component, region, layer, or section discussed below could be termed a second member, component, region, layer, or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Magnetic Sheet for Communications Module

FIG. 1 is a cross-sectional view schematically illustrating an internal configuration of a normal wireless power charging (WPC) system.

Referring to FIG. 1, the normal WPC system may include a wireless power transmitting device 10 and a wireless power receiving device 20.

The wireless power transmitting device 10 generates a magnetic field therearound, and the wireless power receiving device 20 charges power by magnetic induction. The wireless power receiving device 20 may be implemented in various types of electronic products, such as a mobile phone, a laptop computer, or a tablet PC.

In the wireless power transmitting device 10, a transmission coil 11 is formed on a substrate 12. When an AC voltage is applied to the wireless power transmitting device 10, a magnetic field is formed around the transmission coil 11. Accordingly, an electromotive force induced by the transmission coil 11 may be generated in a reception coil 21 embedded in the wireless power receiving device 20 to charge a battery 22 thereof.

The transmission coil 11 and the reception coil 21, electromagnetically coupled with each other, are formed by coiling metal wires such as copper wires. The coiling shape may be circular, oval, tetragonal, or rhombic, and the overall size or the number of coils may be appropriately set according to required characteristics.

A magnetic sheet 100, that is, a WPC shield, may be disposed between the reception coil 21 and the battery 22. The magnetic sheet 100 may be disposed between the reception coil 21 and the battery 22 to prevent a magnetic field generated in the reception coil 21 from reaching the battery 22.

Although the WPC system is described in FIG. 1, a near field communications (NFC) shield, a magnetic secure transmission (MST), or the like may also include a transmission device and reception device, and a magnetic sheet may be disposed between a reception coil of the reception device and a battery.

Meanwhile, there is a trend to mount a WPC coil and an NFC coil to be adjacent to each other on one substrate or simultaneously use the WPC coil and the NFC coil, for space efficiency. However, the present inventive concept is not limited thereto.

However, since each of the WPC, NFC, and MST technologies uses a different operating frequency and requires a magnetic shield having a different magnetic permeability, there is a problem in that magnetic sheets formed of different magnetic materials are used. For example, normally, a ferrite magnetic sheet has been used as a magnetic shield in the NFC system, and a metal ribbon magnetic sheet has been used as a magnetic shield in the WPC and MST systems.

Since the magnetic sheets are separately used in the respective systems, a significant amount of space may be required therefor. In addition, since the magnetic sheets formed of different materials are used, sintering processes may be complicated, and the number of processes may increase.

According to an exemplary embodiment, two or more regions having different degrees of crushing and formed of the same material may be formed in a magnetic sheet for a communications module. Since the magnetic sheet formed of the same magnetic material is simultaneously applied to a WPC shield, an NFC shield, and the like, space efficiency may be maximized, and a manufacturing process may be simplified. Further, transmission efficiency may be optimized at respective operating frequencies of WPC, NFC, and the like, and thus communication efficiency may be improved.

Figure 2:
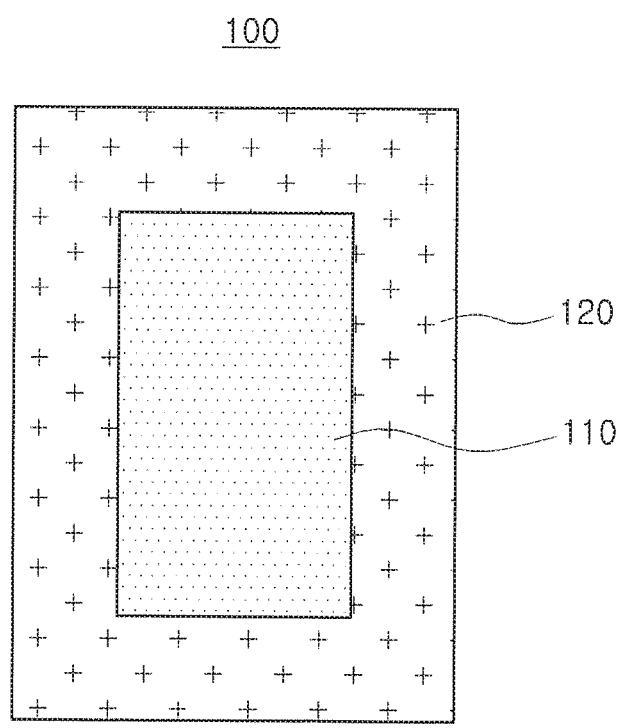
FIG. 2 is a plan view schematically illustrating a magnetic sheet for a communications module according to an exemplary embodiment of the present inventive concept.

FIG. 2 is a plan view schematically illustrating a magnetic sheet for a communications module according to an exemplary embodiment.

Referring to FIG. 2, a magnetic sheet 100 for a communications module according to an exemplary embodiment includes a first region 110 and a second region 120 disposed adjacent to the first region 110. The magnetic sheet 100 according to the exemplary embodiment is crushed to form cracks, and a degree of crushing is different between the first and second regions 110 and 120.

The magnetic sheet 100 is formed of the same magnetic material, such as a sintered ferrite sheet or a thin metal ribbon formed of an amorphous alloy or a nanocrystal alloy.

Here, although the magnetic sheet 100 is formed of the same magnetic material, the first region 110 and the second region 120 have different magnetic permeabilities since the first region 110 and the second region 120 have different degrees of crushing.

Meanwhile, when the magnetic sheet 100 is a metal ribbon, the first region 110 and the second region 120 may have different core losses.

Therefore, the magnetic sheet 100 according to the exemplary embodiment may be simultaneously applied to WPC, NFC, and the like as a shield, and transmission efficiency may be optimized according to respective operating frequencies of the WPC, the NFC, and the like.

According to the exemplary embodiment, the first region 110 of the magnetic sheet 100 may be a WPC shield, and the second region 120 of the magnetic sheet 100 may be an NFC shield. Meanwhile, the second region 120 may be formed around the first region 110.

Figure 3:
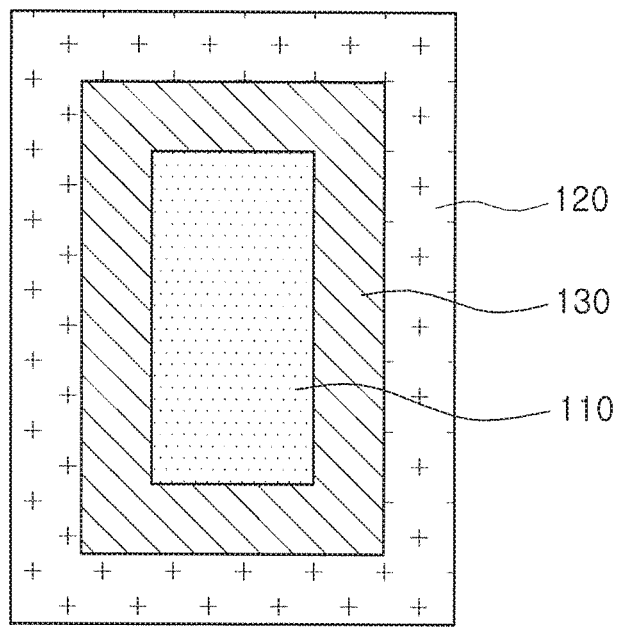
FIG. 3 is a plan view schematically illustrating a magnetic sheet for a communications module according to another exemplary embodiment of the present inventive concept.

FIG. 3 is a plan view schematically illustrating a magnetic sheet for communications module according to another exemplary embodiment.

Referring to FIG. 3, the magnetic sheet 100 for a communications module according to the exemplary embodiment of the present inventive concept includes a first region 110 and a second region 120 having different degrees of crushing, and may further include a third region 130 disposed between the first region 110 and the second region 120 and having a different degree of crushing from the first region 110 and the second region 120.

Referring to FIG. 3, the third region 130 is formed to surround the first region 110, and the second region. 120 is formed to surround the third region 130. Here, according to the exemplary embodiment, the first region 110 of the magnetic sheet 100 may be a WPC shield, the second region 120 of the magnetic sheet 100 may be an NFC shield, and the third region 130 of the magnetic sheet 100 may be an MST shield.

However, the present inventive concept is not limited thereto, and any structure as long as it has different degrees of crushing in different regions so that transmission efficiency is optimized at respective operating frequencies of the WPC, the NFC, the MST, and the like, may be applied. In addition, although the magnetic sheets illustrated in FIGS. 2 and 3 are divided into two and three regions, the present inventive concept is not limited thereto, and the magnetic sheet may be divided into more regions.

For example, an operating frequency of the WPC may be in the range of 110 kHz to 205 kHz, an operating frequency of the NFC may be about 13.56 MHz, an operating frequency of the MST may be about 70 kHz, and an operating frequency of a physical media attachment (PMA) may be in the range of 275 kHz to 357 kHz.

The magnetic sheet 100 according to the exemplary embodiment may be fabricated to have regions having different degrees of crushing, by using a crushing tool having a contact point in which stresses are concentrated at a specific part thereof. The shape of the contact point may be a triangle, a tetragon, a pentagon, a hexagon, or the like, but is not limited thereto. The contact point may have any shape as long as stresses can be concentrated in a specific part thereof. By controlling an interval, depth, or size of the contact point, the degrees of crushing may be controlled.

Regions of the magnetic sheet 100 according to the exemplary embodiment may have different magnetic characteristics (e.g. magnetic permeability or core loss) depending on a structural factor such as a shape or a density of a crack formed by being crushed.

Figure 4:
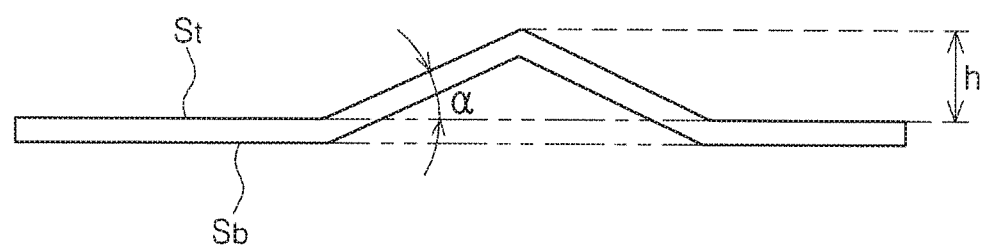
FIG. 4 is a view illustrating a height and an inclination angle of a crack formed in a magnetic sheet for a communications module according to an exemplary embodiment of the present inventive concept.

FIG. 4 is a view illustrating a height and an inclination angle of a crack formed in a magnetic sheet for a communications module according to an exemplary embodiment.

Referring to FIG. 4, a crack formed by crushing a magnetic sheet 100 for a communications module according to the exemplary embodiment may have a three-dimensional structure protruding from one surface St of the magnetic sheet 100. The crack may have a three-dimensional structure in which a height from the one surface St of the magnetic sheet 100 decreases from one point toward a perimeter of the magnetic sheet 100. Here, a height at the one point, that is, the maximum height of the crack, may be defined as a height h of the crack.

In addition, while having the height from the one surface St of the magnetic sheet 100 decreasing from the one point toward the perimeter, the crack may have an inclination angle α with respect to the one surface St of the magnetic sheet 100.

The crack may have a convexly three-dimensional structure in the one surface St of the magnetic sheet 100, and a concavely three-dimensional structure in the other surface Sb of the magnetic sheet 100. That is, the crack may have a structure protruding from the one surface St of the magnetic sheet 100 while recessed the other surface Sb of the magnetic sheet 100.

Meanwhile, according to the exemplary embodiment, the height h of the crack formed by crushing the magnetic sheet 100 from the one surface St of the magnetic sheet 100 may be different between any adjacent regions such as the first and second regions 110 and 120, the first and third regions 110 and 130, and the second and third regions 120 and 130. For convenience of explanation, the first and second regions 110 and 120 will be described by way of example.

In addition, according to the exemplary embodiment, the inclination angle α of the crack formed by crushing the magnetic sheet 100 with respect to the one surface St of the magnetic sheet 100 may be different between the first and second regions 110 and 120.

That is, since the degree of crushing may be different between the first and second regions 110 and 120, the height h and inclination angle α of the crack formed by crushing the magnetic sheet 100 may be different between the first and second regions 110 and 120. Accordingly, magnetic characteristics of the first and second regions 110 and 120 may be implemented to be different, and transmission efficiency may be optimized at respective operating frequencies of the first and second regions 110 and 120.

Figure 5:
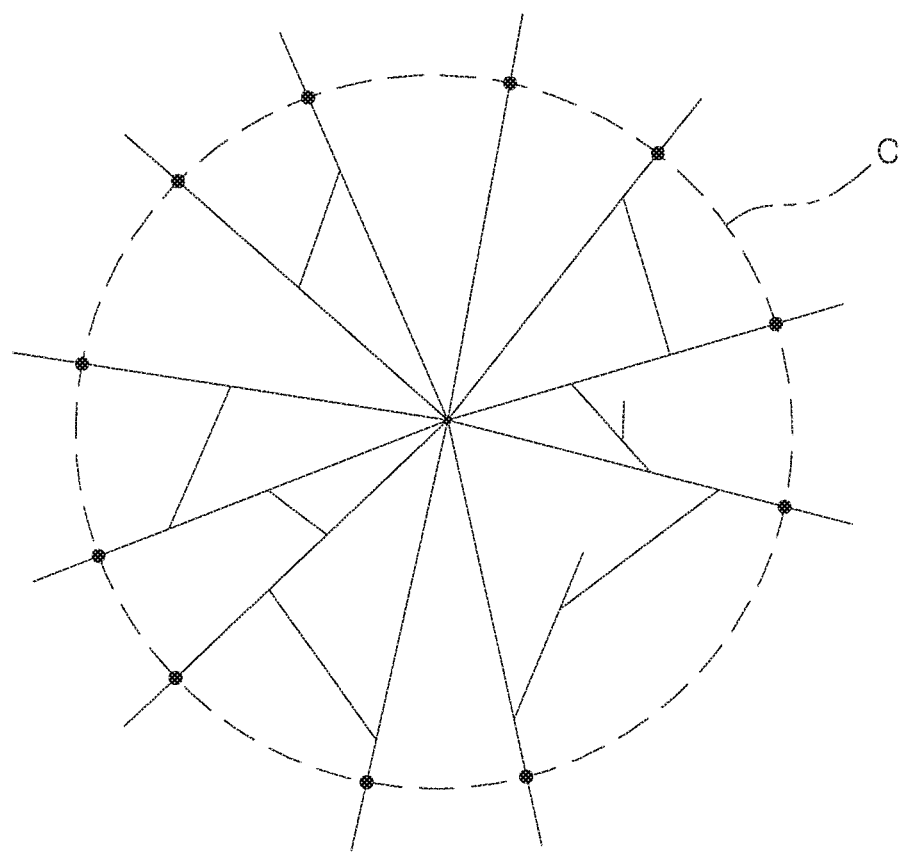
FIG. 5 is a view illustrating an aspect of a crack formed, in a magnetic sheet for a communications module according to an exemplary embodiment of the present inventive concept.

FIG. 5 is a view illustrating an aspect of a crack formed in a magnetic sheet for communications module according to an exemplary embodiment of the present inventive concept.

Referring to FIG. 5, a crack formed by crushing a magnetic sheet 100 for a communications module according to the exemplary embodiment may have a shape extending radially from one point.

Here, as illustrated in FIG. 5, when an imaginary circle c having a specific size is drawn on the crack formed by crushing the magnetic sheet 100, the average number of contact points between the crack and the imaginary circle c may be different in first and second regions 110 and 120. For example, the number of contact points of the crack and the imaginary circle c is eleven in FIG. 5.

That is, when the imaginary circle c having the specific size is drawn on the crack formed by crushing the magnetic sheet 100, the average number of contact points between the crack and the imaginary circle c may be different in the first and second regions 110 and 120 since degrees of crushing are different in the first and second regions 110 and 120. Accordingly, magnetic characteristics may be implemented to be different in the first and second regions 110 and 120, and transmission efficiency may be optimized at respective operating frequencies.

Table 1 below illustrates examples of heights h and inclination angles α of cracks formed by crushing a magnetic sheet 100, and the average numbers of contact points between cracks and an imaginary circle c having a size of about 210 μm are different according to according to operating voltages of WPC, NFC, MST, and PMA.

TABLE 1

| Types | Operating Frequency | Crack Diameter | Crack Height | Crack Inclination | Average Number of Contacts |
|---|---|---|---|---|---|
| MST | 70 kHz | 400 μm ± 100 μm | 20 μm or less | 7° or less | 16 or more |
| WPC | 110 kHz | 400 μm ± 100 μm | 20 μm to 30 μm | 3° or 10° | 15 or more |
| WPC | 205 kHz | 400 μm ± 100 μm | 20 μm to 30 μm | 3° or 10° | 15 or more |
| PMA | 275 kHz | 400 μm ± 100 μm | 20 μm to 30 μm | 3° or 10° | 15 or more |
| PMA | 357 kHz | 400 μm ± 100 μm | 20 μm to 30 μm | 3° or 10° | 15 or more |
| NFC | 13.56 kHz | 400 μm ± 100 μm | 40 μm or more | 7° or more | 14 or less |

Accordingly, since the magnetic sheet 100 according to the exemplary embodiment includes two or more regions having different degrees of crushing, magnetic characteristics (e.g. magnetic permeability or core loss) of respective regions may be different even when the magnetic sheet 100 is formed of the same magnetic material. Accordingly, the magnetic sheet 100 can be simultaneously applied to shields of the WPC, the NFC, and the like, operated at different operating frequencies, and transmission efficiency can be optimized at respective operating frequencies. In addition, since the magnetic sheet 100, which can be a single continuous sheet and formed of the same magnetic material, is simultaneously applied as a WPC shield, an NFC shield, and the like, space efficiency can be maximized and a manufacturing process can be simplified.

In addition, transmission efficiency may be optimized at respective operating frequencies, and thus communication efficiency may be improved.

While exemplary embodiments have been shown and described above, it will be apparent to those skilled in the art that modifications and variations could be made without departing from the scope of the invention as defined by the appended claims.

What is claimed is:

1. A magnetic sheet for a communications module comprising a magnetic material,
    wherein the magnetic sheet is made of a metal ribbon sheet and includes crushed cracks in first and second regions of the magnetic sheet,
    the first and second regions have different magnetic permeabilities, by having different degrees of crushed cracks in the first region and the second region,
    the second region surrounds the first region, and
    the crushed cracks has a structure protruding from a surface of the magnetic sheet and has an inclination angle with respect to the surface.

2. The magnetic sheet for a communications module of claim 1, wherein the magnetic sheet further includes a third region disposed between the first region and the second region and having a degree of crushed cracks different from those of the first and second regions.

3. The magnetic sheet for a communications module of claim 1, wherein an average height of the crushed cracks in the first region from the surface of the magnetic sheet is different from an average height of the crushed cracks in the second region from the surface of the magnetic sheet.

4. The magnetic sheet for a communications module of claim 1, wherein
    an average inclination angle of the crushed cracks in the first region with respect to the surface of the magnetic sheet is different from an average inclination angle of the crushed cracks in the second region with respect to the surface of the magnetic sheet.

5. The magnetic sheet for a communications module of claim 1, wherein when an imaginary circle having a specific size is drawn on the crushed cracks, a average number of contact points between the crushed cracks and the imaginary circle is different in the first region and the second region.

6. The magnetic sheet for a communications module of claim 1, wherein the magnetic sheet is a single continuous sheet made of a same magnetic material.

7. A magnetic sheet for a communications module comprising a magnetic material,
    wherein the magnetic sheet is made of a metal ribbon sheet and includes a wireless power charging (WPC) shield and a near field communications (NFC) shield disposed adjacent to the WPC shield,
    the WPC shield and the NFC shield have different magnetic permeabilities, by having different degrees of crushed cracks in the WPC shield and the NFC shield, the NFC shield surrounds the WPC shield, and
    the crushed cracks has a structure protruding from a surface of the magnetic sheet and has an inclination angle with respect to the surface.

8. The magnetic sheet for a communications module of claim 7, wherein the magnetic sheet further includes a magnetic secure transmission (MST) shield having a different degree of crushed cracks from those of the WPC shield and the NFC shield.

9. The magnetic sheet for a communications module of claim 7, wherein an average height of the crushed cracks in the WPC shield from the surface of the magnetic shield is different from an average height of the crushed cracks in the NFC shield from the surface of the magnetic shield or an average inclination angle of the crushed cracks in the WPC shield from the surface of the magnetic shield is different from an average inclination angle of the crushed cracks in the NFC shield from the surface of the magnetic shield.

10. The magnetic sheet for a communications module of claim 7, wherein when an imaginary circle having a specific size is drawn on the crushed cracks, a average number of contact points between the crushed cracks and the imaginary circle is different from those in the WPC shield and the NFC shield.

11. The magnetic sheet for a communications module of claim 7, wherein the magnetic sheet is a single continuous sheet made of a same magnetic material.

12. A magnetic sheet for a communications module, comprising:
    a magnetic material; and
    cracks in first to third regions in the magnetic sheet,
    wherein the first to third regions of the magnetic sheet are formed of a same magnetic material and have different magnetic characteristics,
    the third region surrounds the first region, and the second region surrounds the third region, and
    the cracks has a structure protruding from a surface of the magnetic sheet and has an inclination angle with respect to the surface.

13. The magnetic sheet for a communications module of claim 12, wherein
    one of an average height from the surface of the magnetic sheet, an average inclination angle with respect to the surface of the magnetic sheet, and density of the cracks in one of the first to third regions is different from a corresponding value of the cracks in another of the first to third regions.

14. The magnetic sheet for a communications module of claim 12, wherein the magnetic sheet is a single continuous sheet made of a same magnetic material.

15. The magnetic sheet for a communications module of claim 7, wherein
    the magnetic sheet further includes a magnetic secure transmission (MST) shield having a different degree of crushed cracks from those of the WPC shield and the NFC shield, and
    the MST shield surrounds the WPC shield, and the NFC surrounds the MST shield.

16. The magnetic sheet for a communications module of claim 1, wherein
    the magnetic sheet further includes a third region having a degree of crushed cracks different from those of the first and second regions, and the third region surrounds the first region, and the second region surrounds the third region.

17. The magnetic sheet for a communications module of claim 1, wherein
a degree of crushed cracks of the second region surrounding the first region corresponds to operating frequencies of a near field communications, and
a degree of crushed cracks of the first region surrounded by the second region corresponds to operating frequencies of a wireless power charging.

18. The magnetic sheet for a communications module of claim 7, wherein
a degree of crushed cracks of a near field communications shield surrounding a wireless power charging shield corresponds to operating frequencies of a near field communications, and
a degree of crushed cracks of a wireless power charging shield surrounded by a near field communications shield corresponds to operating frequencies of a wireless power charging.

19. The magnetic sheet for a communications module of claim 12, wherein
a degree of crushed cracks of the third region surrounding the first region corresponds to operating frequencies of a magnetic secure transmission,
a degree of crushed cracks of the second region surrounding the third region corresponds to operating frequencies of a near field communications, and
a degree of crushed cracks of the first region surrounded by the second region corresponds to operating frequencies of a wireless power charging.

* * * * *